United States Patent
Sakurada et al.

(10) Patent No.: US 7,407,866 B2
(45) Date of Patent: Aug. 5, 2008

(54) SOI WAFER AND A METHOD FOR PRODUCING THE SAME

(75) Inventors: Masahiro Sakurada, Fukushima (JP); Nobuaki Mitamura, Fukushima (JP); Izumi Fusegawa, Fukushima (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 385 days.

(21) Appl. No.: 10/542,376

(22) PCT Filed: Jan. 22, 2004

(86) PCT No.: PCT/JP2004/000547

§ 371 (c)(1),
(2), (4) Date: Jul. 14, 2005

(87) PCT Pub. No.: WO2004/066390

PCT Pub. Date: Aug. 5, 2004

(65) Prior Publication Data

US 2006/0113594 A1    Jun. 1, 2006

(30) Foreign Application Priority Data

Jan. 23, 2003  (JP) .............................. 2003-015072
Jan. 23, 2003  (JP) .............................. 2003-015396

(51) Int. Cl.
*H01L 21/00* (2006.01)

(52) U.S. Cl. ................. 438/455; 438/149; 257/347; 117/13

(58) Field of Classification Search ............. 438/455, 438/149; 257/347; 117/13
See application file for complete search history.

(56) References Cited

U.S. PATENT DOCUMENTS

| | | | | |
|---|---|---|---|---|
| 5,037,503 | A | * | 8/1991 | Kajimoto et al. .......... 117/31 |
| 5,238,875 | A | * | 8/1993 | Ogino ..................... 438/459 |
| RE35,242 | E | * | 5/1996 | Kajimoto et al. .......... 117/31 |
| 5,728,211 | A | * | 3/1998 | Takano et al. ............ 117/14 |
| 6,174,364 | B1 | * | 1/2001 | Yamanaka et al. ......... 117/20 |
| 6,190,452 | B1 | * | 2/2001 | Sakurada et al. ......... 117/20 |
| 6,284,629 | B1 | | 9/2001 | Yokokawa et al. |

(Continued)

FOREIGN PATENT DOCUMENTS

EP    971395 A1    1/2000

(Continued)

*Primary Examiner*—Laura M Schillinger
(74) *Attorney, Agent, or Firm*—Oliff & Berridge, PLC

(57) ABSTRACT

An SOI wafer in which a base wafer and a bond wafer respectively consisting of silicon single crystal are bonded via an oxide film, and then the bond wafer is thinned to form a silicon active layer, wherein the base wafer is formed of silicon single crystal grown by Czochralski method, and the whole surface of the base wafer is within N region outside OSF region and doesn't include a defect region detected by Cu deposition method, or the whole surface of the base wafer is within a region outside OSF region, doesn't include a defect region detected by Cu deposition method, and includes I region containing dislocation cluster due to interstitial silicon. Thereby, there is provided an SOI wafer that retains high insulating properties and has an excellent electrical reliability in device fabrication even in the case of forming an extremely thin interlevel dielectric oxide film with, for example, a thickness of 100 nm or less.

6 Claims, 12 Drawing Sheets

U.S. PATENT DOCUMENTS

| | | | | |
|---|---|---|---|---|
| 6,313,014 | B1* | 11/2001 | Sakaguchi et al. | 438/475 |
| 6,482,260 | B2* | 11/2002 | Sakurada et al. | 117/20 |
| 6,565,822 | B1* | 5/2003 | Hoshi et al. | 423/328.2 |
| 6,893,499 | B2* | 5/2005 | Fusegawa et al. | 117/13 |
| 6,913,646 | B2* | 7/2005 | Sakurada et al. | 117/13 |
| 7,091,107 | B2* | 8/2006 | Yokokawa et al. | 438/455 |
| 7,129,123 | B2* | 10/2006 | Sakurada et al. | 438/166 |
| 7,214,268 | B2* | 5/2007 | Sakurada et al. | 117/19 |
| 7,226,507 | B2* | 6/2007 | Mitamura et al. | 117/13 |
| 7,258,744 | B2* | 8/2007 | Sakurada et al. | 117/200 |
| 7,294,196 | B2* | 11/2007 | Sakurada et al. | 117/20 |
| 7,311,888 | B2* | 12/2007 | Takeno et al. | 423/328.2 |
| 7,323,048 | B2* | 1/2008 | Sakurada et al. | 117/20 |
| 2001/0000093 | A1* | 4/2001 | Sakurada et al. | 117/13 |
| 2003/0106484 | A1* | 6/2003 | Fusegawa et al. | 117/19 |
| 2003/0116082 | A1* | 6/2003 | Sakurada et al. | 117/20 |
| 2004/0166650 | A1* | 8/2004 | Yokokawa et al. | 438/455 |
| 2005/0064632 | A1* | 3/2005 | Sakurada et al. | 438/149 |
| 2005/0205004 | A1* | 9/2005 | Sakurada et al. | 117/200 |
| 2005/0252441 | A1* | 11/2005 | Sakurada et al. | 117/13 |
| 2006/0065184 | A1* | 3/2006 | Sakurada et al. | 117/19 |
| 2006/0075957 | A1* | 4/2006 | Takeno et al. | 117/84 |
| 2006/0086313 | A1* | 4/2006 | Sakurada | 117/89 |
| 2006/0113594 | A1* | 6/2006 | Sakurada et al. | 257/347 |
| 2006/0130740 | A1* | 6/2006 | Sakurada | 117/20 |
| 2006/0174819 | A1* | 8/2006 | Mitamura et al. | 117/13 |
| 2007/0017433 | A1* | 1/2007 | Sakurada et al. | 117/13 |
| 2008/0035050 | A1* | 2/2008 | Sakurada | 117/13 |

FOREIGN PATENT DOCUMENTS

| | | |
|---|---|---|
| EP | 1 170 405 A1 | 1/2002 |
| EP | 1 347 083 A1 | 9/2003 |
| JP | A 11-040786 | 2/1999 |
| JP | A 11-297583 | 10/1999 |
| JP | A 2000-030995 | 1/2000 |
| JP | A 2000-294470 | 10/2000 |
| JP | A 2001-044398 | 2/2001 |
| JP | A 2001-146498 | 5/2001 |
| JP | 2002201093 A * | 7/2002 |
| JP | A 2002-201093 | 7/2002 |
| WO | WO 00/62343 A1 | 10/2000 |
| WO | WO 01/36719 A1 | 5/2001 |
| WO | WO 02/053812 A1 | 7/2002 |
| WO | WO 2004066390 A1 * | 8/2004 |

* cited by examiner

FIG. 2
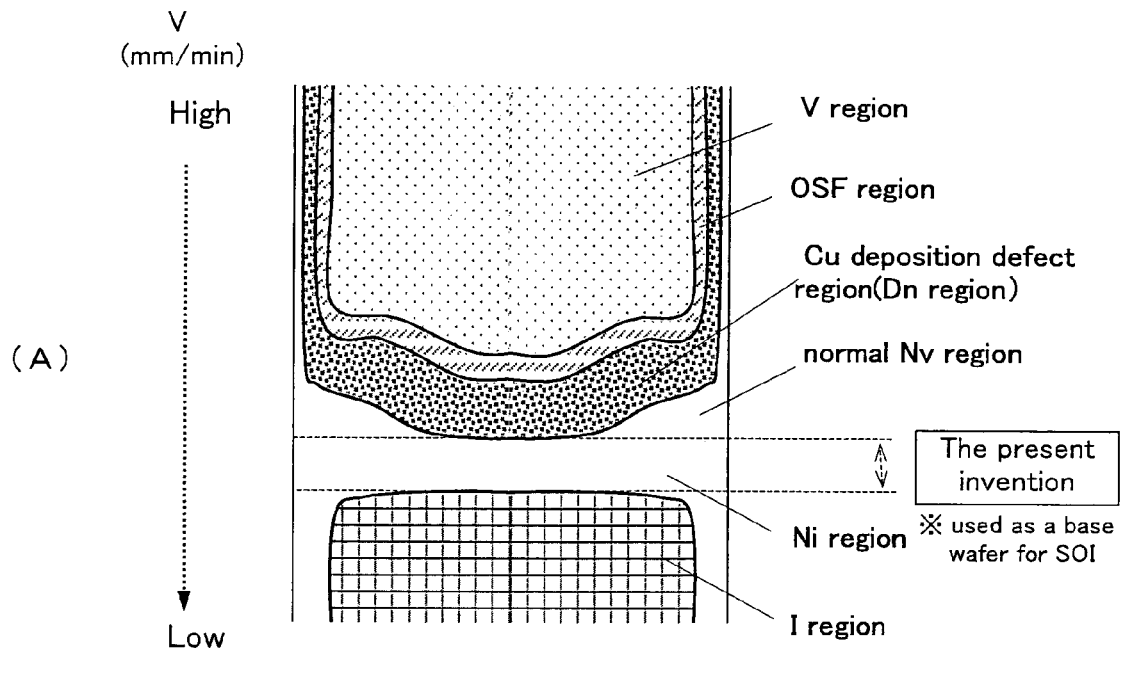
(A)
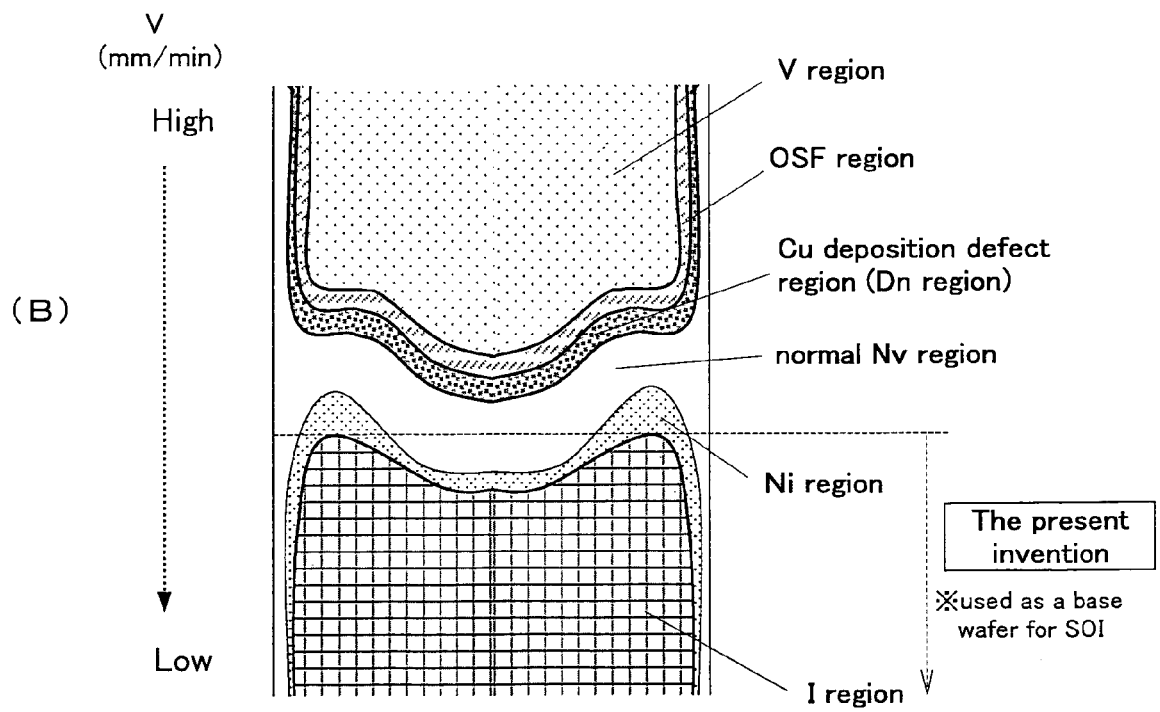
(B)

FIG. 10
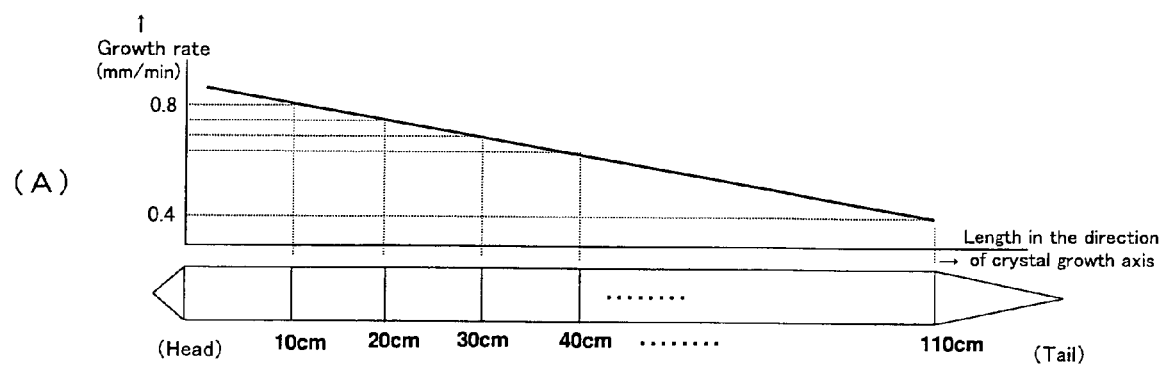
(A)
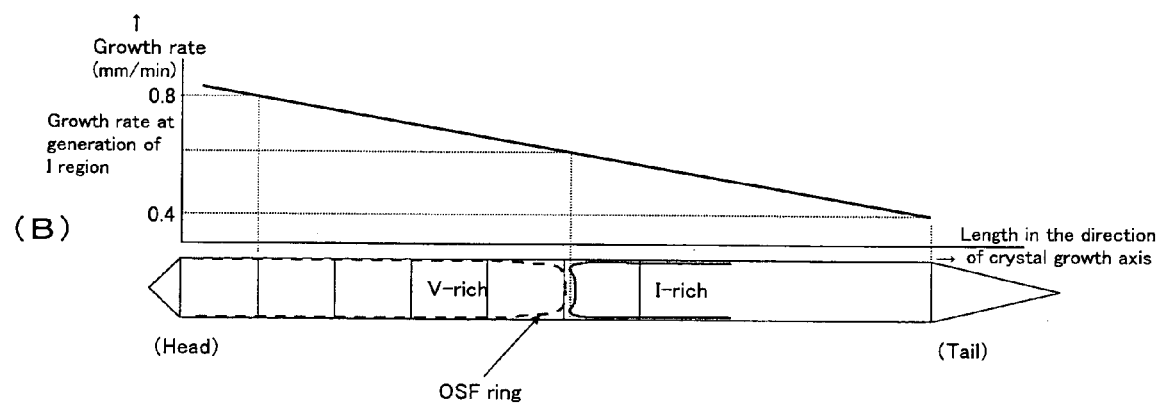
(B)

SOI WAFER AND A METHOD FOR PRODUCING THE SAME

TECHNICAL FIELD

The present invention relates to an SOI wafer, more particularly, to an SOI wafer having extremely high electrical reliability and high quality, and to a method for producing such an SOI wafer.

BACKGROUND ART

Conventionally, as a substrate for a device, an SOI wafer wherein a silicon active layer (an SOI layer) is formed on a support substrate has been widely utilized. As a method for producing such an SOI wafer, for example, it is known that a so-called bonding method in which two silicon wafers are bonded together via an oxide film.

In ion implantation delamination method which is one of bonding methods, an oxide film (which is also referred to as buried oxide film or interlevel dielectric oxide film) is formed as insulating layer on a surface of a silicon wafer (a bond wafer) to become a silicon active layer or a silicon wafer (a base wafer) to be a support substrate, and an ion-implanted layer (a micro bubble layer) is formed inside the bond wafer by implanting ions such as hydrogen ion from one side surface of the bond wafer. Further, after the surface of the ion-implanted side of the bond wafer is bonded to the base wafer via the oxide film, delamination is performed at the ion-implanted layer by heat treatment. Thereby, an SOI wafer in which a thin silicon active layer is formed on the base wafer via the oxide film can be obtained. Further, after the delimitation, there are also some cases that a heat treatment (a bonding heat treatment) for improving bonding strength between the silicon active layer and the base wafer, cleaning with hydrofluoric acid for removing an oxide film on the surface, or the like is performed.

A silicon single crystal grown by Czochralski method (CZ method) can be generally used as a silicon wafer for producing an SOI wafer as described above. However, in recent years, the demand for thinning the silicon active layer and the buried oxide film increases, and the demand for quality of a silicon wafer applicable to this has also become strict.

Especially, it has been proposed that silicon single crystal with low defect density is grown and a silicon wafer with high quality obtained from the crystal is used as a bond wafer to become the silicon active layer.

Hereafter relations between pulling rate when growing silicon single crystal by Czochralski method and defect of the silicon single crystal to be grown will be explained.

It is known that in the case of changing a growth rate V from high speed to low speed in the direction of a crystal growth axis in a CZ pulling apparatus with a usual furnace structure (hot zone: HZ) inducing a large temperature gradient G at the vicinity of a solid-liquid interface in a crystal, a defect distribution diagram as shown in FIG. 9 can be obtained.

In FIG. 9, V region is a region that contains a large amount of vacancies, i.e., depressions, pits, or the like caused by lack of silicon atoms, and I region is a region that contains a large amount of dislocations or clusters of excess silicon atoms caused by existence of interstitial silicon that is excess silicon atoms. It has also been confirmed that there exists a neutral (hereinafter occasionally abbreviated as N) region that contains no (or little) lack or excess of the atom between V region and I region, and defects called OSF (Oxidation Induced Stacking Fault) are distributed in a ring shape (hereinafter occasionally referred to as OSF ring) near a boundary of V region when observed in the cross section perpendicular to a crystal growth axis.

When the growth rate is relatively high, there exist grown-in defects such as FPD, LSTD and COP, which are considered due to voids consisting of agglomerated vacancy-type point defects, at a high density over the entire radial direction of the crystal, and a region containing these defects becomes V region. Further, along with lowering of the growth rate, the OSF ring is generated from the periphery of the crystal, and N region is generated outside the ring (at lower speed side). When the growth rate is much further lowered, the OSF ring shrinks to the center of the wafer and disappears, so that the entire plane becomes N region. When the growth rate is further lowered, there exist at a low density, L/D (Large Dislocation: an abbreviation for interstitial dislocation loop, such as LSEPD, LFPD and the like) defects (huge dislocation clusters) which are considered due to dislocation loops consisting of agglomerated interstitial silicon, and the region where these defects exist becomes I region (occasionally referred to as L/D region).

N region located between the V region and the I region and outside the OSF ring becomes a region containing no FPD, LSTD and COP to be generated due to voids as well as no LSEPD and LFPD to be generated due to interstitial silicon. In addition, it has been recently found that by further classifying N region, as shown in FIG. 9, there exist Nv region (the region where a lot of vacancies exist) adjacent to the outside of OSF ring and Ni region (the region where a lot of interstitial silicon exist) adjacent to I region, and that when performing thermal oxidation treatment, there exists a large amount of oxygen precipitation in Nv region and little oxygen precipitation in Ni region.

Although such an N region conventionally existed only in a part of a plane of wafer, a crystal having N region over the entire radial plane (the entire surface of wafer), as shown in FIG. 9, has also been able to be manufactured by controlling V/G that is a ratio of a pulling rate (V) to an axial temperature gradient (G) at a solid-liquid interface in a crystal.

And so, in the manufacture of an SOI wafer, there has been proposed a method in which a silicon single crystal wafer having N region over the entire surface is used as a bond wafer. For example, there has been proposed an SOI wafer wherein a silicon single crystal is pulled by controlling a ratio of the pulling rate V to the axial temperature gradient G at a solid-liquid interface of the crystal (V/G) within a predetermined range when it is pulled by Czochralski method, and the silicon wafer in N region is used as a bond wafer (for example, see Japanese Patent Laid-open (Kokai) No. 2001-146498 (on pages 5-8) and Japanese Patent Laid-open (Kokai) No. 2001-44398 (on pages 2-4, in FIG. 1)).

On the other hand, a base wafer is essentially necessary for supporting an SOI layer via an insulator film, and device is not fabricated directly on the surface of the base wafer. Therefore, there has also been proposed that a dummy-grade silicon wafer of which resistivity and the like do not meet product standards is used as a base wafer (see Japanese Patent Laid-open (Kokai) No. 11-40786).

In general, in view of improving quality and productivity and so on, a silicon single crystal including V region or further partially including OSF region or Nv region is grown with pulling rate at high speed as shown in FIG. 9, and a silicon wafer processed to have mirror surface from such a silicon single crystal grown at high speed has been widely used as a base wafer.

Vacancy defects such as COP consisting of agglomerated vacancies are formed with high density on the surface and in the bulk of the silicon wafer obtained from silicon single crystal grown at high speed as described above, and there exist many micro pit defects having the size of 50 nm or more on the surface of the silicon wafer. And when an SOI wafer is produced by using such a silicon wafer having many micro pit defects as a base wafer, especially in the case that a thinner buried oxide film is formed as recently demanded, there arises a problem that high insulating property is not retained and electrical reliability is degraded.

DISCLOSURE OF THE INVENTION

The present invention was accomplished in view of the aforementioned problems, and its object is to provide an SOI wafer that retains high insulating property and has an excellent electrical reliability in device fabrication process even in the case of forming buried oxide film with extremely thin thickness, for example, 100 nm or less.

In order to achieve the aforementioned object, according to the present invention, there is provided an SOI wafer in which a base wafer and a bond wafer respectively consisting of silicon single crystal are bonded via an oxide film, and then the bond wafer is thinned to form a silicon active layer, wherein the base wafer is formed of silicon single crystal grown by Czochralski method, and the whole surface of the base wafer is within N region outside OSF region and doesn't include a defect region detected by Cu deposition method, or the whole surface of the base wafer is within a region outside OSF region, doesn't include a defect region detected by Cu deposition method, and includes I region containing dislocation cluster due to interstitial silicon.

As described above, in the case of the SOI wafer in which the whole surface of the base wafer consisting of CZ silicon single crystal is within N region outside OSF region and doesn't include a defect region detected by Cu deposition method, there does not exist micro defects on the surface of the base wafer. Therefore, an SOI wafer having an extremely excellent electrical reliability is obtained, of which dielectric breakdown property is not degraded due to defects on the surface of the base wafer, even in the case that thickness of the buried oxide film on the base wafer is thin like 100 nm or less.

On the other hand, in the case of the SOI wafer wherein the whole surface of the base wafer consisting of CZ silicon single crystal is within a region outside OSF region and doesn't include a defect region detected by Cu deposition method and the base wafer includes I region containing dislocation cluster due to interstitial silicon, there does not exist micro vacancy defects on the surface of the base wafer. Therefore, an SOI wafer having an extremely excellent electrical reliability is obtained, in which dielectric breakdown is not happened due to vacancy defects on the surface of the base wafer, even in the case that thickness of buried oxide film on the base wafer is thin like 100 nm or less. Further, in the case that a base wafer is comprised of, for example, a silicon wafer the whole surface of which is I region, since such a silicon wafer can be produced with comparative ease, the SOI wafer can be obtained with low cost.

In this case, the SOI wafer is preferably produced by ion implantation delamination method in which ions are implanted into the bond wafer and the bond wafer is thinned by delamination at the ion-implanted layer.

There is another bonding method, in which after bonding a bond wafer and a base wafer, the bond wafer is thinned by grinding and polishing to produce an SOI wafer. However, in this case a thickness of SOI layer of this SOI wafer becomes relatively thick. On the contrary, according to ion implantation delamination method, depth of ion-implanted layer, that is, thickness of an SOI layer can be achieved up to extremely thin level as recently demanded, thereby an SOI wafer with extremely high quality can be obtained.

A thickness of the oxide film can be in the range from 10 to 100 nm.

Thickness of the buried oxide film is demanded to be 50 nm or so in recent years. The SOI wafer of the present invention is not degraded in dielectric breakdown property and retains high insulating property even in the case that such an extremely thin oxide film is formed.

Further, it is preferable that the silicon active layer consists of silicon single crystal which is grown by Czochralski method, and the whole surface of which is within N region outside OSF region and doesn't include defect region detected by Cu deposition method.

As mentioned above, when the silicon active layer also consists of silicon single crystal grown by Czochralski method, and the whole surface of the silicon active layer is within N region outside OSF region and doesn't include defect region detected by Cu deposition method, the region for fabricating device has no defects, and an SOI wafer with extremely high quality can be obtained in which the silicon active layer and the buried oxide layer are not destroyed due to defects of the silicon active layer even in the case being subjected to cleaning with hydrofluoric acid.

Moreover, in the present invention, there is also provided a method for producing an SOI wafer as mentioned above. Namely, there is provided a method for producing an SOI wafer comprising at least the steps of forming an oxide film at least on one of a base wafer and a bond wafer respectively consisting of silicon single crystal, implanting ions into the bond wafer to form an ion-implanted layer, bonding the surface of the ion-implanted side of the bond wafer and the base wafer via the oxide film, delaminating the bond wafer at the ion-implanted layer as a boundary, wherein the base wafer is used, which is formed of silicon single crystal grown by Czochralski method, and the whole surface of the base wafer is within N region formed at lower speed than OSF region generated in a ring shape when grown with gradually decreasing pulling rate from high speed to low speed, and doesn't include defect region detected by Cu deposition method, or the whole surface of the base wafer is within a region formed at lower speed than OSF region generated in a ring shape when grown with gradually decreasing pulling rate from high speed to low speed, doesn't include defect region detected by Cu deposition method, and includes I region containing dislocation cluster due to interstitial silicon.

When producing an SOI wafer by ion implantation delamination method, if a CZ silicon single crystal wafer the whole surface of which is defect-free as mentioned above is used as a base wafer, an SOI wafer having high electrical reliability and high quality can be produced, even in the case that a buried oxide film is formed with a thickness of 100 nm or less, because it doesn't happen that dielectric breakdown property of the oxide film is degraded due to defects existing on the base wafer during bonding heat treatment and the like.

On the other hand, when producing an SOI wafer by ion implantation delamination method, if a CZ silicon single crystal wafer which doesn't include defect region detected by Cu deposition method, and includes I region containing dislocation cluster due to interstitial silicon as mentioned above, is used as a base wafer, an SOI wafer having high electrical reliability and high quality can be produced even in the case that a buried oxide film is formed with a thickness of 100 nm or less, because it doesn't happen that dielectric breakdown property of the oxide film is degraded due to vacancy defects existing on the base wafer during bonding heat treatment and the like. Further, since a silicon wafer used as a base wafer, for example, the whole surface of which is within I region, can be produced with wider controlled range and with comparative ease, it follows that an SOI wafer with high quality can be produced with ease and at low cost.

In these cases, it is preferable to use the bond wafer which is formed of silicon single crystal grown by Czochralski method, and the whole surface of which is within N region formed at lower speed than OSF region generated in a ring shape when grown with gradually decreasing pulling rate from high speed to low speed and doesn't include defect region detected by Cu deposition method.

As mentioned above, in the case that an SOI wafer is produced by using defect-free wafer as a bond wafer, device to be formed on the SOI layer is not affected adversely, degradation of dielectric breakdown property of interlevel oxide film can be surely prevented, thus an SOI wafer with extremely high quality can be produced.

Further, there has been recently proposed a method that in the case that an SOI wafer is produced by ion implantation delamination method, delaminated bond wafer (delaminated wafer) is subjected to reclaim process and is reused as a base wafer (or a bond wafer) (see Japanese Patent Laid-open (Kokai) No. 11-297583, for example). Accordingly, if the bond wafer that is defect-free as mentioned above is used and then delaminated wafer is subjected to reclaim process and is reused as a base wafer or a bond wafer, thereby production cost can be lowered and an SOI wafer with high quality can be produced.

As explained above, according to the present invention, there is provided an SOI wafer wherein the whole surface of the base wafer is within N region and doesn't include a defect region detected by Cu deposition method. Such an SOI wafer has excellent dielectric breakdown property even in the case that a thickness of the buried oxide film is 100 nm or less. Therefore, if a device is fabricated by using such an SOI wafer, a device having an excellent electric property can be fabricated with high yield.

Further, according to the present invention, there is provided an SOI wafer wherein the whole surface of the base wafer is within a region outside OSF region, doesn't include a defect region detected by Cu deposition method, and includes I region containing dislocation cluster due to interstitial silicon. In this case, since the base wafer can be produced with comparative ease, production cost can be lowered.

BRIEF DESCRIPTION OF THE DRAWINGS

FIG. 2(A) is an explanatory view showing an example of a region of a crystal used for manufacturing an SOI wafer according to the present invention.

FIG. 2(B) is an explanatory view showing another example of a region of a crystal used for manufacturing an SOI wafer according to the present invention.

FIG. 10(A) shows the relationship between a growth rate of a single crystal and a cutting position of the crystal.

FIG. 10(B) is an explanatory view showing a growth rate and each region.

BEST MODE FOR CARRYING OUT THE INVENTION

Figure 1:
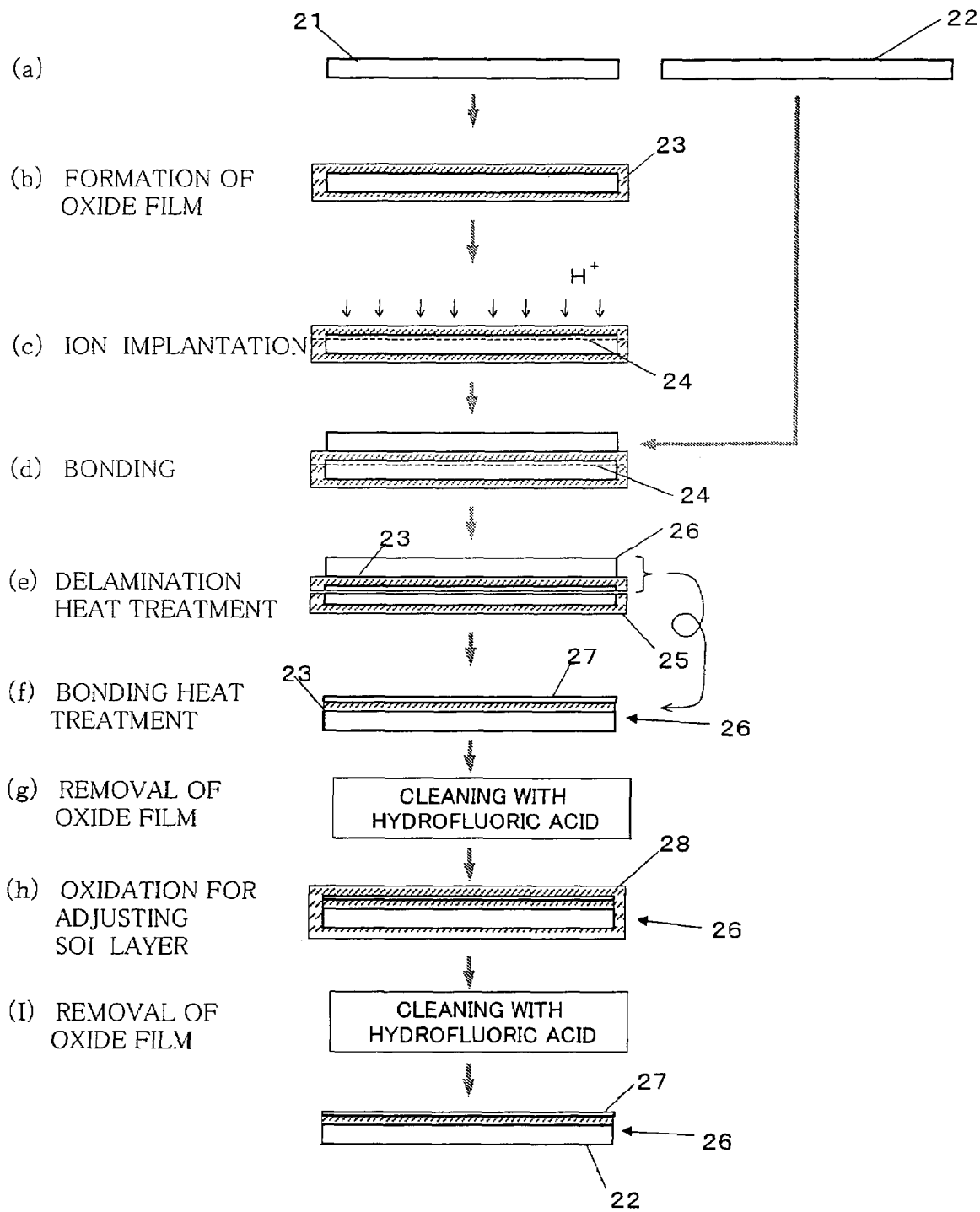
FIG. 1 is a flowchart showing an example of a manufacturing process of an SOI wafer according to the present invention.

Hereinafter, the present invention will be explained in more detail.

The inventors of the present invention performed the thorough investigations for effect given to a buried oxide film by a base wafer of an SOI wafer produced by a bonding method. Consequently, it has been found that, when an SOI wafer is produced using a silicon single crystal grown at high speed conventionally used in general, namely a silicon wafer having many vacancy-type micro defects with the size of 50 nm or more on the surface, in the case that a buried oxide film has enough thickness of several hundred nm or more, problems like degradation of dielectric breakdown property due to effect of the base wafer are hardly arisen, however, in the case that the buried oxide film is a thin film having a thickness less than 100 nm, there's a possibility of having difficulties in retaining insulating property due to effect of the base wafer. It has also been found that particularly in the case that the buried oxide film is formed with thickness around 50 nm level as demanded in recent years, a conventional V-rich base wafer affects the buried oxide film during bonding heat treatment and the like, so that there's extremely strong possibility that high insulating property cannot be retained and electrical reliability is degraded.

Then the inventors of the present invention thought that an SOI wafer with high electrical reliability of which dielectric breakdown property is not degraded even in the case that the buried oxide film is formed with a thickness of 100 nm or less, can be obtained by reducing micro defects of the base wafer, and further performed the following investigations and studies.

First, it has been known that, when pulling a silicon single crystal, in the case of gradually lowering a growth rate from high speed to low speed from a shoulder to an tail of straight body of the crystal, as mentioned above, OSF shrinks at a certain growth rate, and after that, phases of, in order, Nv region, Ni region and I (huge dislocation clusters generating) region are formed in lower speed regions. Recently, it has been also found that there partially exists in Nv region, a region where defects can be detected by Cu deposition method immediately after disappearance of OSF (hereinafter occasionally referred to as Cu deposition defect region), as shown in FIG. 2 (A) (for example, see Japanese Patent Laid-open (Kokai) 2002-201093).

Cu deposition method is a method for evaluating a wafer, by which positions of defects in a semiconductor wafer can be accurately measured, detection limit for defects in the semiconductor wafer can be improved, and finer defects can be accurately measured and analyzed.

The specific evaluation method of a wafer comprises forming an insulator film with a predetermined thickness on a surface of the wafer, electrically destroying the insulator film on the defect part formed near the surface of the wafer, and depositing electrolyte such as Cu at the defect part. Namely, Cu deposition method is an evaluation method utilizing the fact that when electric potential is applied to an oxide film formed on the surface of the wafer in the liquid where Cu ions are dissolved, electric current flows to the part where the oxide film is degraded, and Cu ions are precipitated as Cu. It is known that defects such as COPs exist in the part where an oxide film is apt to be degraded.

The defect part of the wafer where Cu is deposited can be analyzed by observation with the naked eye under a collimated light or directly, to evaluate a distribution and density thereof. Furthermore, it can also be confirmed by microscope observation, a transmission electron microscope (TEM), a scanning electron microscope (SEM), or the like.

And the inventors of the present invention performed further investigations about defects in these regions.

Specifically, when a growth rate of a silicon single crystal is gradually lowered from high speed to low speed, the V region just before disappearance of OSF was subjected to FIB (Focused Ion Beam) processing after identification of a coordinate by a surface inspection apparatus (MAGICS™). When the points were observed by TEM, the existence of micro pit defects with about 20 nm could be confirmed. Voids become finer as V region is a region just before disappearance of OSF, however, micro pit defects in V region remarkably degrade time zero dielectric breakdown (TZDB) characteristic even if they are considerably fine.

On the other hand, when gradually lowering a growth rate of a silicon single crystal from high speed to low speed, as to Cu deposition defect region immediately after disappearance of OSF, there is no marked deterioration of breakdown voltage level as in V region, and although the TZDB characteristic indicates C mode in a region of almost 100% in plane, a little deterioration in time dependent dielectric breakdown (TDDB) characteristic was seen.

As a result of these investigations and studies, it was found that upon progress of thinning of buried oxide film demanded for particular devices recently, not only in the case that a bond wafer, namely a silicon active layer consists of conventionally used silicon single crystal wafer occupied by V region, OSF region or N region wherein Cu deposition defect region exists, but also in the case that such a silicon wafer is used as a base wafer, an insulating property of the oxide film has difficulties and there is a possibility that failure relating to electrical properties may be generated.

Further, vacancy-type defects existing in these regions have a possibility that they cause degradation of film quality of the buried oxide film during bonding heat treatment. In particular, in the case of the buried oxide film having a thin thickness of less than 100 nm, it was found that the vacancy-type defects cause that excellent insulating property cannot be retained, electrical fault is generated and that electrical reliability is extremely degraded.

Consequently, in order to avoid such an electrical failure, the inventors of the present invention found that if a base wafer of an SOI wafer is a mirror surface wafer occupied by N region that doesn't include even a defect region detected by Cu deposition method, there can be obtained an SOI wafer which has an excellent electrical property even in the case that the buried oxide film is formed with a thickness of 100 nm or less.

However, in order to grow silicon single crystal that is within N region and doesn't include Cu deposition defect region, the growth rate is limited to narrow range, and it has demanded advanced technique of crystal growth such as maintaining V/G at a determined value. Accordingly, productivity and production yield is low and that may result in cost increase.

Then, the inventors of the present invention further investigated and found that in the case that a CZ silicon wafer including I region that can be easily produced at lower growth rate without advanced technique of crystal growth is used as a base wafer, an SOI wafer with excellent electrical property can be produced at low cost even if buried oxide film is formed with a thickness of 100 nm or less. Thus, they accomplished the present invention.

Hereinafter, embodiments of the present invention will be explained in detail by referring to the appended drawings, but the present invention is not limited thereto.

FIG. 1 is a flowchart showing an example of a manufacturing process of an SOI wafer according to the present invention by ion implantation delamination method.

First, in the first process (a), two mirror-polished silicon wafers, i.e., a bond wafer 21 that is to be SOI layer and a base wafer 22 that is to be a substrate, are prepared. Here in the present invention, there is used as a base wafer 22, a silicon wafer the whole surface of which is within N region formed at lower speed than OSF region generated in a ring shape in the case of gradually decreasing pulling rate from high speed to low speed when grown by Czochralski method, and doesn't include a defect region detected by Cu deposition method (the first embodiment), or a silicon wafer the whole surface of which is within a region formed at lower speed than OSF region generated in a ring shape in the case of gradually decreasing pulling rate from high speed to low speed when grown, doesn't include defect region detected by Cu deposition method, and includes I region containing dislocation cluster due to interstitial silicon (the second embodiment).

Figure 3:
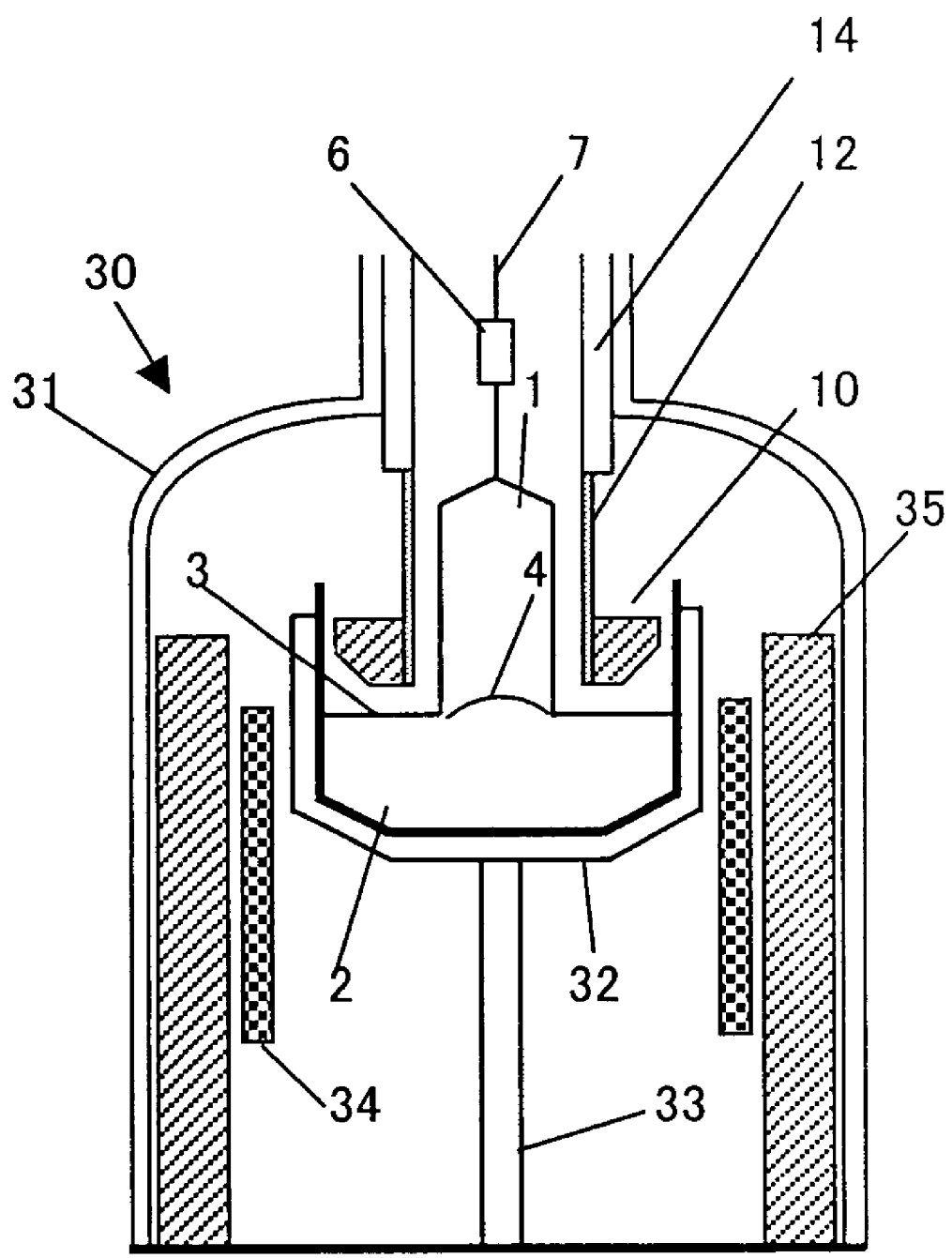
FIG. 3 shows an example of an apparatus for producing a CZ silicon single crystal that can be used in the present invention.

First, the aforementioned silicon single crystal of the first embodiment which is within N region and has no Cu deposition defect region can be grown while controlling V/G by using, for example, an apparatus 30 for producing a single crystal as shown in FIG. 3.

The apparatus 30 for pulling a single crystal has a pulling chamber 31, a crucible 32 installed in the pulling chamber 31, a heater 34 disposed around the crucible 32, a crucible holding shaft 33 and a rotation mechanism (not shown) thereof for rotating the crucible 32, a seed chuck 6 for holding a silicon seed crystal, a wire 7 for pulling the seed chuck 6, and a winding mechanism (not shown) for rotating or winding up the wire 7. A heat insulation material 35 is disposed around heater 34.

The crucible 32 is composed of an inner quartz crucible for accommodating a silicon melt (melt) 2 and an outer graphite crucible located outside the quartz crucible.

Recently, it is also often the case that a method, so-called MCZ method, is used in which magnets not shown are disposed horizontally outside the pulling chamber 31 and a magnetic field in the horizontal direction, the vertical direction, or the like is applied to the silicon melt 2 to inhibit convection of the melt and achieve stable growth of a single crystal.

A cylindrical graphite cylinder (heat shielding plate) 12 is provided as surrounding a grown silicon single crystal 1, and further in the vicinity of a solid-liquid interface 4 of the crystal, an annular outer heat insulation material 10 is provided outside the graphite cylinder. And in some cases an inner heat insulation material is further provided inside the graphite cylinder 12. This heat insulation material 10 is disposed so that a gap of 2-20 cm is formed between the lower end of the material and a surface 3 of the silicon melt 2. Thereby, difference between temperature gradient Gc [° C./cm] at the center part of the crystal and temperature gradient Ge in the periphery of the crystal becomes small, and it is also possible to control temperature inside a furnace so that, for example, the temperature gradient in the periphery of the crystal is lower than that at the center of the crystal.

A cooling cylinder 14 is placed on the graphite cylinder 12 to perform forced cooling by flowing refrigerant inside. Furthermore, it is also possible to provide a cylindrical cooling device that cools a single crystal by blowing cooling gas or shielding radiation heat.

In order to produce a silicon single crystal using the apparatus 30 for pulling a single crystal, first, a highly pure polycrystalline material of silicon is heated to the melting point (approximately 1420° C.) or higher to be melted in the crucible 32. Then, the tip end of the seed crystal is brought into contact with or immersed in the approximately central portion of the surface of the melt 2 by unwinding the wire 7. Subsequently, while the crucible holding shaft 33 is rotated, the wire 7 is wound up with being rotated. Thereby, the seed crystal is also pulled with rotating, and growth of a silicon single crystal is initiated. Then, an approximately cylindrical single crystal ingot 1 can be obtained by adequate control of a pulling rate and temperature.

In order to grow a silicon single crystal occupied by N region and including no Cu deposition defect region, for example, a crystal is grown with controlling a growth rate between the growth rate at the boundary where the defect region detected by Cu deposition method remaining after disappearance of OSF region generated in a ring shape is disappeared when gradually decreasing a growth rate (pulling rate) of silicon single crystal from high speed to low speed during pulling and the growth rate at the boundary where interstitial dislocation loop is generated when gradually decreasing a growth rate of silicon single crystal further.

Namely, when a growth rate of a silicon single crystal being pulling is gradually lowered from high speed to low speed from the shoulder of the crystal through the tail of straight body thereof, as shown in FIG. 2(A), each phase of, in order, V region, OSF ring region, Cu deposition defect region, Nv region, Ni region and I region (huge dislocation cluster generating region) is formed depending on its growth rate V. And, the single crystal is grown by controlling a growth rate between the growth rate at the boundary where a defect region detected by Cu deposition method remaining after disappearance of OSF ring disappears in N region and the growth rate at which I region is generated when the growth rate is gradually lowered further. By this manner, a silicon single crystal of N region containing neither of V region defects such as FPD, I region defects such as huge dislocation clusters (LSEPD, LFPD), OSF defects, nor defects detected by Cu deposition method can be grown.

After the silicon single crystal grown as described above is processed into mirror-polished wafer (PW), the PW is picked out at random from a unit lot for each ingot block and then evaluation by Cu deposition method is performed. Thus, in the case of free of defects, the wafer can be applied as a base wafer 22.

By the way, a bond wafer 21 can be selected depending on quality required for a silicon active layer. If the same as the base wafer 22, namely the wafer the whole surface of which is within N region formed at lower speed than OSF region generated in a ring shape, and doesn't include defect region detected by Cu deposition method is used as a bond wafer 21, it turns out that no micro defects exist in a silicon active layer, and therefore characteristics of device to be formed thereon can be improved. And even in the case that buried oxide film is formed with a thickness of around 50 nm, degradation of dielectric breakdown characteristics due to effect of the base wafer during subsequent bonding heat treatment and the like can be surely prevented, and extremely high electrical reliability can be achieved.

Furthermore, if the same as a base wafer 22 is used as a bond wafer 21, and delaminated bond wafer is subjected to reclaim process and is reused as mentioned below, an SOI wafer having high electrical reliability can be produced at a lower cost.

However, in order to produce such a silicon wafer the whole surface of which is defect-free, V/G has to be controlled uniformly over the whole growth step of silicon single crystal to form N region in radial direction of crystal, so that setting range of growth rate is extremely limited, further, extremely advanced technique of crystal growth is necessary, in some cases it results in cost increase for production.

Therefore, in the second embodiment of the present invention, as mentioned above, there can be used as a base wafer 22, a silicon wafer consisting of CZ silicon single crystal which is within a region formed at lower speed than OSF region generated in a ring shape when grown with gradually decreasing pulling rate from high speed to low speed, does not include defect region detected by Cu deposition method, and includes I region containing dislocation cluster due to interstitial silicon.

Such a silicon single crystal can be grown without advanced technique of crystal growth as required in the case of growing silicon single crystal the whole surface of which is defect-free. For example, when a silicon single crystal the whole surface of which is I region is grown, it can be grown at lower growth rate and with comparative ease and there is no need of restriction like controlling V/G uniformly in radial direction of the crystal during crystal growth. If the V/G in radial direction of crystal is not uniform, in the case of producing crystal occupied by I region, it is possible to use G higher than that of hot zone used for producing crystal occupied by N region, namely to use hot zone having large temperature gradient at the vicinity of a solid-liquid interface in a crystal. Accordingly, depending on design of hot zone, a single crystal the whole surface of which is within I region can be pulled at higher rate than growing single crystal the whole surface of which is within N region. It is because there is no need to control V/G value in crystal plane uniformly.

In addition, a base wafer 22 in the second embodiment of the present invention is not limited to the wafer the whole surface of which is within I region, and a wafer consisting of silicon single crystal that includes, in addition to I region, Ni region wherein interstitial silicon is dominant as shown in FIG. 2(B) and doesn't include Cu deposition defect region can be used. Since such an wafer also doesn't have defects due to vacancies on the surface, its dielectric breakdown property is not degraded even in the case that buried oxide film is thin.

On the other hand, a bond wafer 21 can be used depending on quality demanded for a silicon active layer in the same way as the first embodiment. But since device is fabricated on the silicon active layer, existence of defects on the silicon active layer affects the quality of device. Accordingly, a wafer consisting of silicon single crystal without micro defects is preferably used as a bond wafer 21. Therefore, the wafer the whole surface of which is within N region formed at lower speed than OSF region generated in a ring shape, and doesn't include defect region detected by Cu deposition method is preferably used as a bond wafer 21.

Next, in the process (b) of FIG. 1, a surface of at least either of the bond wafer 21 or the base wafer 22 is oxidized. The bond wafer 21 can be thermally oxidized herein to form an oxide film 23 on the surface. Here, the oxide film 23 is formed with a thickness that demanded insulating property can be retained. In the present invention, extremely thin oxide film having a thickness of 10 nm-100 nm can also be formed.

If a conventionally used wafer such as a silicon wafer having many vacancy-type micro defects with the size of 50 nm or more on the surface is used as a base wafer and an SOI wafer is produced with a buried oxide film having a thickness of 100 nm or less, the oxide film is affected by vacancy defects existing on the surface of the base wafer and there is a possibility that the oxide film is destroyed by the following bonding heat treatment and heat treatment during device fabrication process. However, in the present invention, since a silicon wafer that is within N region and doesn't include even extremely micro defects existing in Cu deposition defect region (the first embodiment), or a silicon wafer consisting of CZ silicon single crystal that doesn't include defect region detected by Cu deposition method, and includes I region containing dislocation cluster due to interstitial silicon (the second embodiment), is used as a base wafer 22, the oxide film is not destroyed even by evaluation of Cu deposition method. Therefore, there occur no problem like degradation of dielectric breakdown property even in the case that the oxide film 23 is formed with a thickness of, for example, 100 nm or less.

If a thickness of the oxide film 23 is less than 10 nm, it takes less time for forming the oxide film, however, there is a possibility that an insulating property cannot be retained. Therefore, the thickness of the oxide film is preferably 10 nm or more.

In the process (c), hydrogen ions are implanted from one surface of the bond wafer 21 on the surface of which the oxide film 23 is formed. Rare gas ions or mixture gas ions of hydrogen ions and rare gas ions may also be implanted. Thereby, an ion-implanted layer 24 parallel to the surface of the wafer at an average penetration depth of ions can be formed inside the wafer. The depth of the ion-implanted layer is reflected in a thickness of an SOI layer to be formed finally. Accordingly, by implanting ions with controlling implantation energy etc., it is also possible to control a thickness of an SOI layer and to make an SOI layer having a thickness of for example 200 nm or less.

In the process (d), the surface of the ion-implanted side of the bond wafer 21 and a surface of the base wafer 22 are bonded together via the oxide film 23. For example, by contacting the surfaces of two wafers 21 and 22 with each other under a clean atmosphere at room temperature, both wafers are bonded without an adhesive agent, or the like.

Next, in the process (e), a part of the bond wafer 21 is delaminated at the ion-implanted layer 24 by heat treatment. For example, if the wafers in which the bond wafer 21 and the base wafer 22 are bonded together are subjected to a heat treatment under an inert gas atmosphere at a temperature of about 500° C. or more, the wafers are separated into a delaminated wafer 25 and an SOI wafer 26 (an SOI layer 27+a buried oxide film 23+the base wafer 22) due to rearrangement of the crystal and aggregation of bubbles.

Here, as to a delaminated wafer 25 being by-product, there has been proposed a method that its delaminating plane is subjected to reclaim process such as polishing and it is reused as a base wafer or a bond wafer. As mentioned above, because a silicon wafer that is within N region and doesn't include Cu deposition defect region is used as a bond wafer 21, a silicon wafer obtained by processing the delaminated wafer 25 by reclaim process can be used as either a base wafer or a bond wafer. Accordingly, by reusing the delaminated wafer 25, for example, as a base wafer 22, an SOI wafer with the same high quality can be produced. Namely, since an SOI wafer according to the present invention can be produced substantially from one silicon wafer, production cost can be lowered.

In the process (f), the SOI wafer 26 is subjected to a bonding heat treatment. In this process (f), the SOI wafer 26 is subjected to a heat treatment at high temperature as a bonding heat treatment to make bonding strength sufficient, since bonding strength between the wafers brought into close contact in the aforementioned bonding step (d) and the delamination heat treatment step (e) is too weak to be used as it is in a device fabrication process. For example, this heat treatment can be performed in a range from 30 minutes to 2 hours at 1050° C.-1200° C. under an inert gas atmosphere.

Upon such a heat treatment at high temperature, because the whole surface of the base wafer 22 is defect-free or the whole surface of the wafer doesn't include vacancy-type micro defects, dielectric breakdown property of the buried oxide film 23 is not degraded and high insulating property can be retained.

In the process (g), an oxide film formed on the surface of the SOI wafer 26 is removed by cleaning with hydrofluoric acid. At this time, if vacancy-type defects exist in the silicon active layer 27, there is a possibility that HF reaches a buried oxide film through the defects and thereby micro pits are generated. However, because the silicon active layer 27 consists of silicon single crystal which is within N region overall and doesn't include a defect region detected by Cu deposition method, it will never happen that the pits enlarge by cleaning with hydrofluoric acid, and thereby the SOI layer 27 and the buried oxide film 23 are destroyed.

Further, in the process (h), according to need, oxidation for adjusting a thickness of the SOI layer 27 is performed and subsequently in the process (I), so-called sacrificial oxidation in which an oxide film 28 is removed by cleaning with hydrofluoric acid is performed.

In the SOI wafer 26 manufactured through the processes (a)-(I) as described above, the base wafer 22 consists of CZ silicon single crystal, and the whole surface of which is within N region outside OSF region and doesn't include a defect region detected by Cu deposition method, or consists of CZ silicon single crystal, and the whole surface of which is within a region outside OSF region, doesn't include a defect region detected by Cu deposition method and includes I region containing dislocation cluster due to interstitial silicon.

On the other hand, the silicon active layer 27 consists of CZ silicon single crystal, and the whole surface of which is within N region outside OSF region and doesn't include a defect region detected by Cu deposition method. Namely, because there exists no vacancy-type micro defects on the surface of the base wafer 22, even in the case that the buried oxide film 23 is formed with an extremely thin thickness, high insulating property is retained and extremely high electrical reliability is achieved. Moreover, because the SOI layer 27 is defect-free, extremely high yield can be achieved when device fabrication is performed.

Hereinafter, the present invention will be explained in reference to examples, however, the present invention is not limited thereto.

EXAMPLE 1

(Experiment 1) Confirmation of Pulling Conditions:

By using the apparatus 30 for producing a single crystal shown in FIG. 3, the experiment on gradual lowering of a crystal growth rate was performed as described below and the growth rates at boundaries between respective regions were examined.

First, 150 kg of polycrystalline silicon as a raw material was charged in a quartz crucible having a diameter of 24 inches (600 mm), and a silicon single crystal having a diameter of 210 mm was grown. Oxygen concentration was controlled in the range of 23-26 ppma (ASTM'79 value). When growing the single crystal, as shown in FIG. 4(A), a growth rate was controlled to be linearly and gradually lowered from a head to a tail of the crystal in the range from 0.70 mm/min to 0.30 mm/min.

Figure 4:
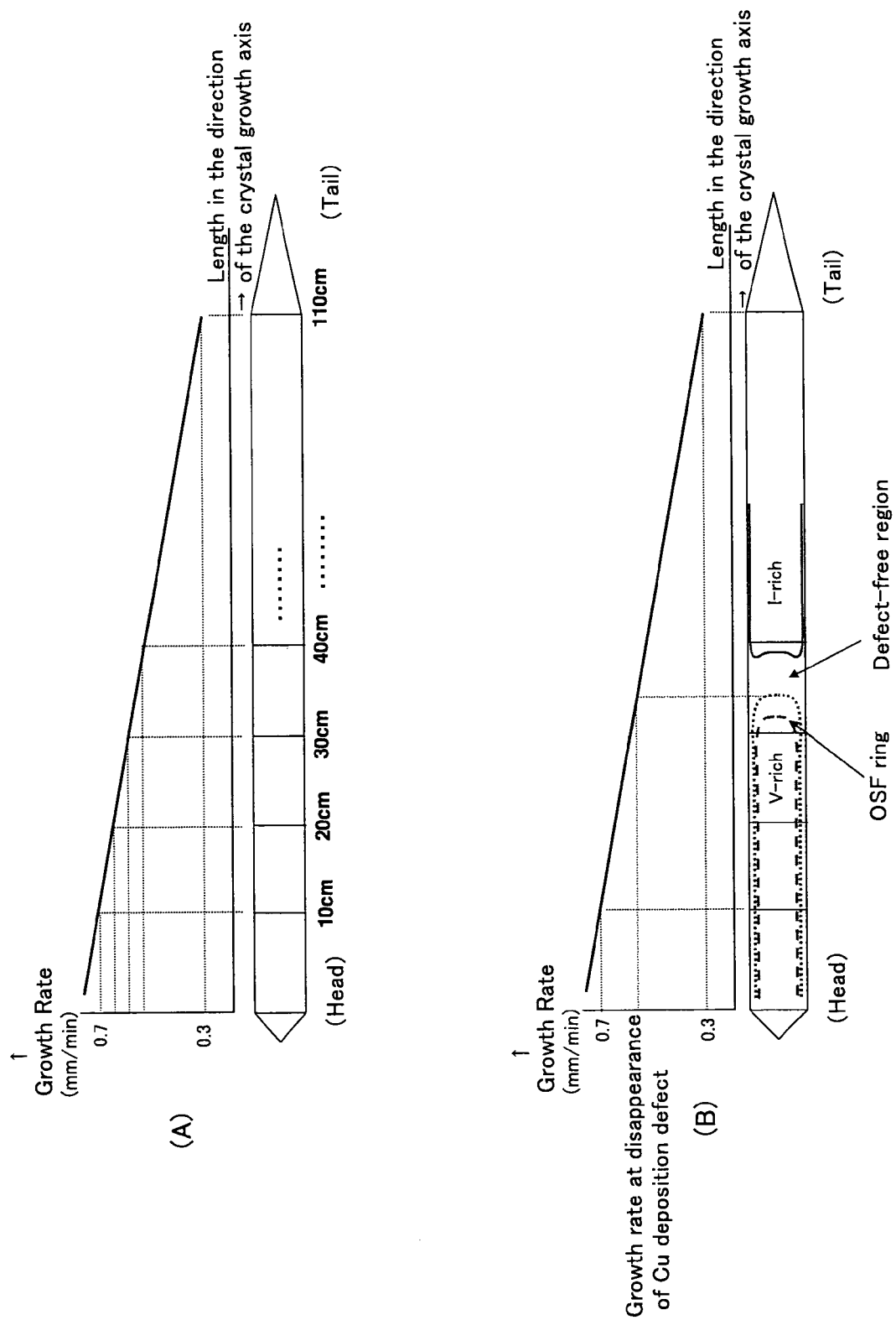
FIG. 4(A) shows the relationship between a growth rate of a single crystal and a cutting position of the crystal.
FIG. 4(B) is an explanatory view showing the relationship between a growth rate and each region.

Then, as shown in FIGS. 4(A) and (B), the pulled single crystal was cut lengthwise in the direction of the crystal growth axis from the head to the tail, and after that, mirror-finished samples in a shape of a wafer having a diameter of 200 mm were produced.

As to one of the samples, a distribution of each region of V region, OSF region and I region, and the growth rates at the boundaries of the regions were confirmed by means of wafer lifetime (WLT) measurement (measuring instrument: SEMILAB WT-85) after heat treatment for oxygen precipitation. Further, another sample was subjected to Cu deposition treatment after forming a thermal oxide film, and a distribution of oxide film defects was confirmed. The detailed evaluation process in this experiment will be given below.

Figure 5:
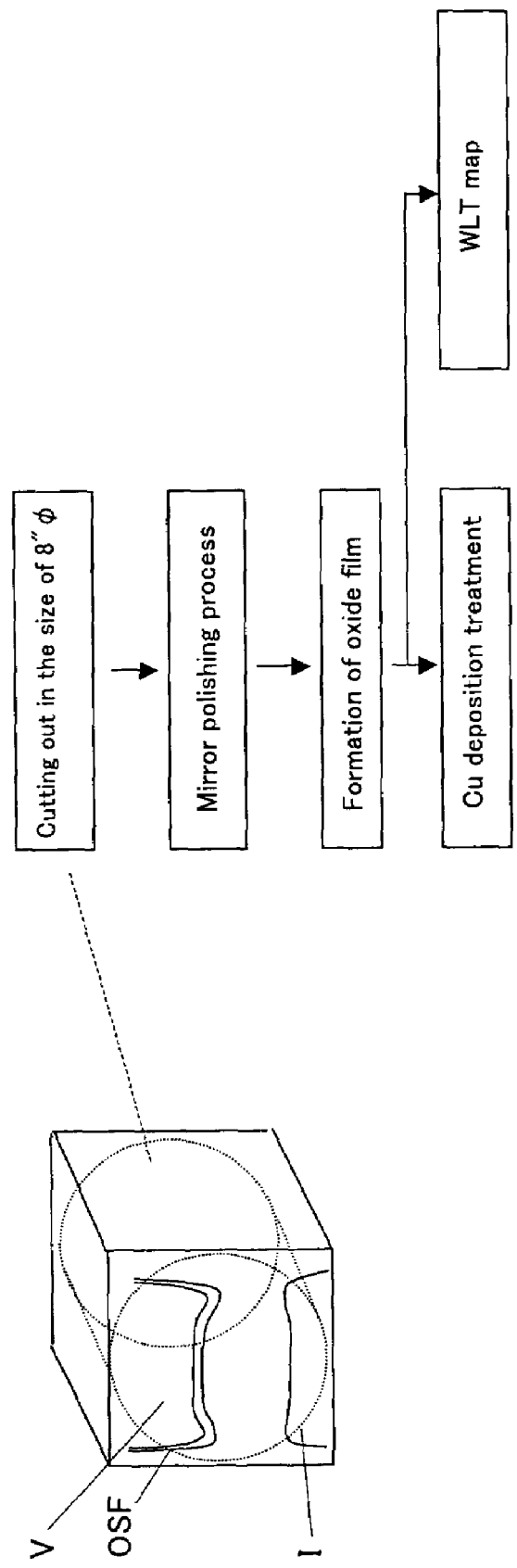
FIG. 5 is an explanatory view showing a method for producing a sample for Cu deposition evaluation.

(a) The ingot having a diameter of 210 mm was cut into blocks by a length of 10 cm in the direction of a crystal growth axis, and each of them was then cut lengthwise in the direction of the crystal growth axis. Thereafter, mirror-finished samples in a shape of wafer with a diameter of 200 mm (8 inches) in a direction perpendicular to the crystal growth axis as shown in FIG. 5 were obtained.

(b) One of the above samples was subjected to heat treatment at 620° C. for 2 hours (nitrogen atmosphere) in a heat treatment furnace for wafer and to subsequent two-step heat treatment consisting of heat treatment at 800° C. for 4 hours (nitrogen atmosphere) and heat treatment at 1000° C. for 16 hours (dried oxygen atmosphere). Then it was cooled and a WLT map was created by SEMILAB WT-85.

(c) The second sample was subjected to Cu deposition treatment after forming a thermal oxide film on its surface, and a distribution of oxide film defects was confirmed. The evaluation conditions were as follows.

1) Oxide film: 25 nm,
2) field intensity: 6 MV/cm,
3) time of impressed voltage: 5 minutes.

Results of the Experiment

Figure 6:
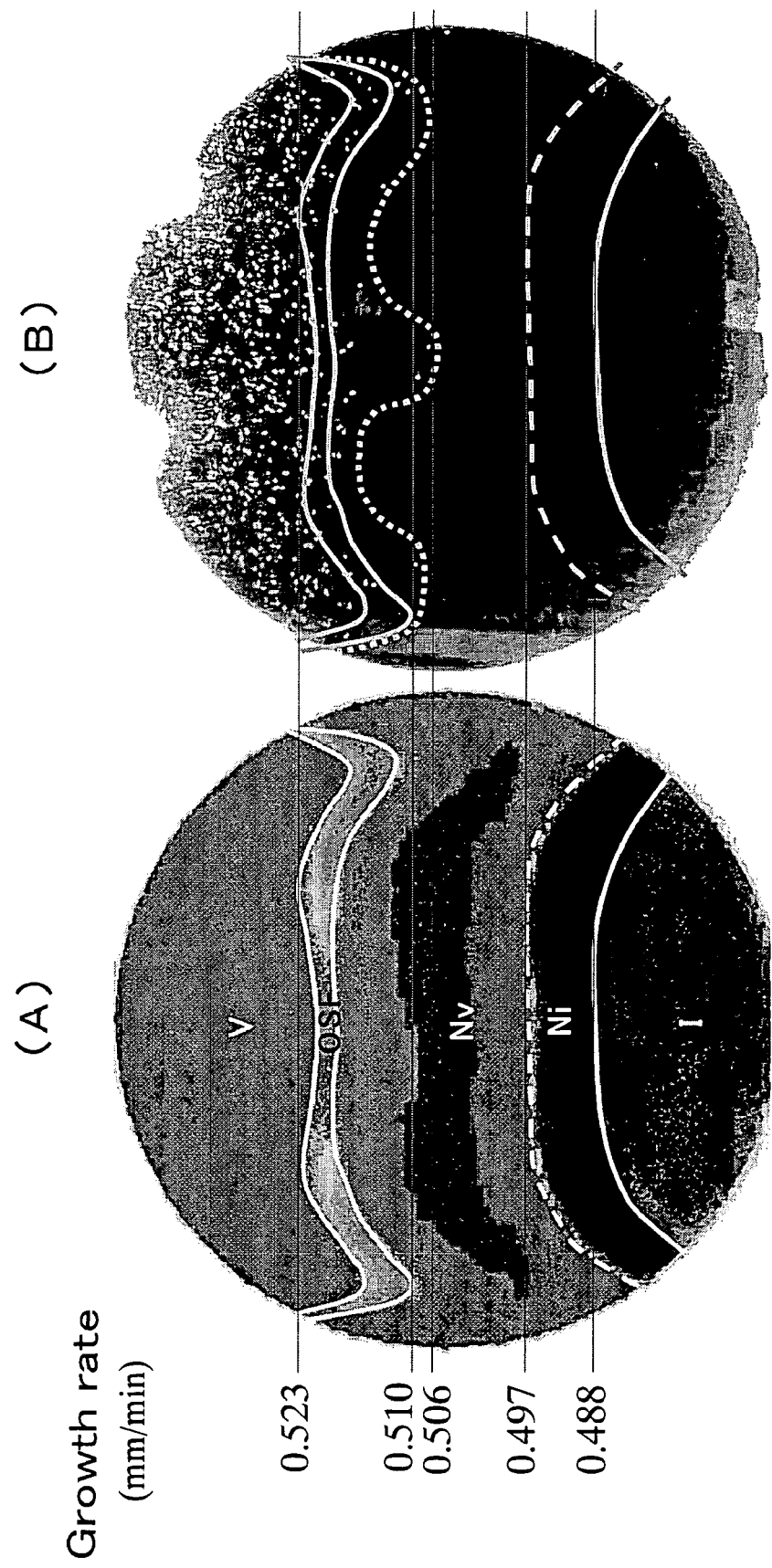
FIG. 6 shows (A) wafer lifetime and (B) Cu deposition defects in a cross-section when cutting a crystal lengthwise.

The results as shown in FIGS. 6(A) and (B) were obtained from the above-mentioned experiment, and growth rates at the boundaries of regions such as V region, OSF region, N region and I region were confirmed.

V region/OSF region boundary: 0.523 mm/min,

OSF disappearing boundary: 0.510 mm/min,

Cu deposition defect disappearing boundary: 0.506 mm/min, precipitation N region/non-precipitation N region boundary: 0.497 mm/min, non-precipitation N region/I region boundary: 0.488 mm/min.

Figure 7:
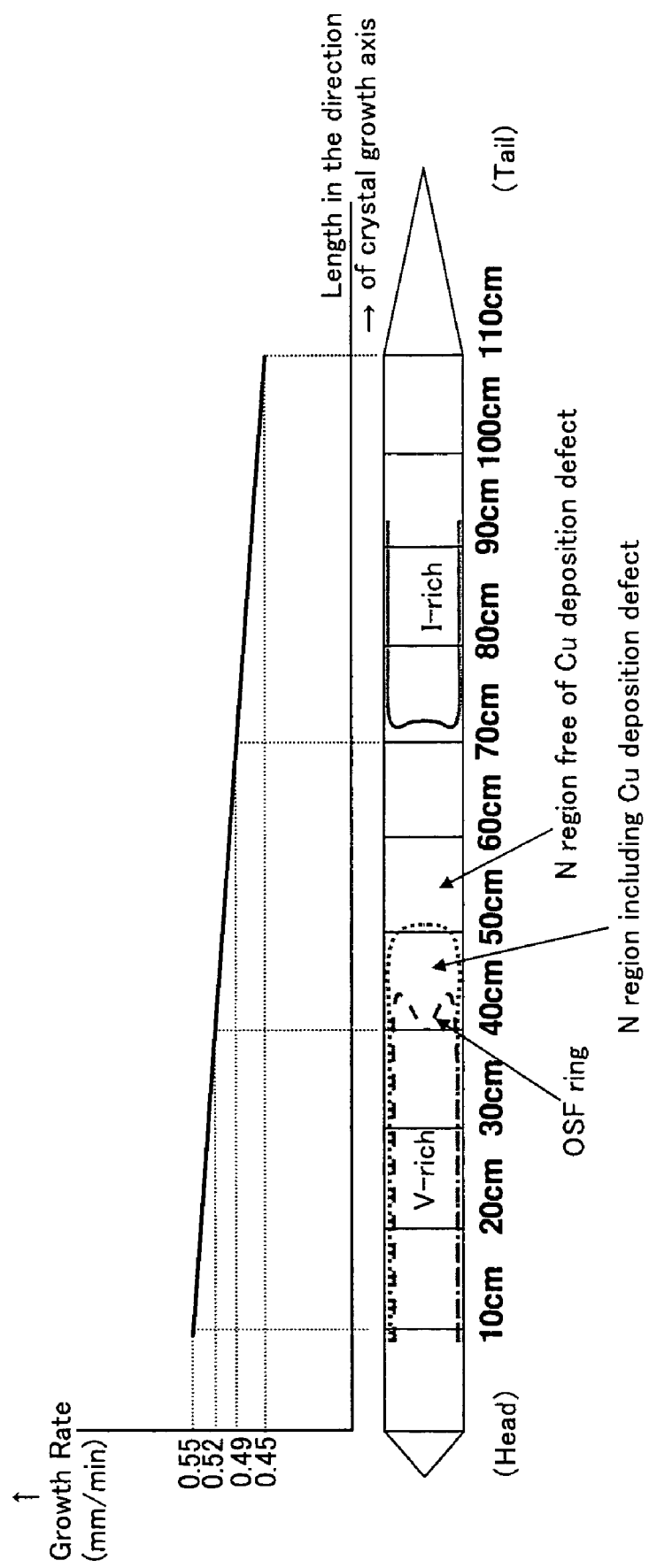
FIG. 7 shows a growth rate and a cutting position of a crystal in Experiment 2.

(Experiment 2) Manufacture of an SOI Wafer:

In the same apparatus as Experiment 1 shown in FIG. 3, 150 kg of polycrystalline silicon as a raw material was charged into a 24-inch quartz crucible. In this time, as shown in FIG. 7, a growth rate was lowered more gradually than that in Experiment 1 in the range from 0.55 mm/min to 0.45 mm/min from a head to a tail of an ingot with a diameter of 210 mm, and controlled so that N region including Cu deposition defects and N region not including Cu deposition defects were formed in the region from 40 cm to 70 cm of a straight body of a crystal. Also, the crystal was produced so that the oxygen concentration was 24-26 ppma (ASTM'79). Then, the quality evaluation and SOI processing were performed according to the following procedure.

(1) After pulling the crystal, wafers were cut out in order from the head side of each crystal block in the direction of the crystal growth axis. The numbers were printed on the wafers by laser marking so as to identify the order of cutting, and the wafers were mirror-polished.

(2) The first PW from the head side of each unit block was divided into ¼ size, and FPD, LFPD, LSEP and OSF were investigated. Subsequently, as to the second PW from the head side of each unit block, a distribution of Cu deposition defects was observed. 5 PWs in total that were the third PW through the seventh PW from the head side of each unit block were put into a process for manufacturing SOI wafers (SOI process). Again, as to the eighth PW from the head side, FPD, LFPD, LSEP and OSF were evaluated, as to the ninth PW, a distribution of Cu deposition defects was observed, and 5 PWs in total that were the tenth PW through the fourteenth PW were put into the SOI process. In this manner, among a unit of 7 PWs in the direction of the crystal growth axis, 2 PWs from the head side were evaluated in quality, and remaining 5 PWs were processed into SOI wafers.

(3) As a result of the evaluation described above, the region up to half of a block cut from the position from about 40 cm to 50 cm of a straight body of the crystal was V region and OSF region, the region up to approximately 50 cm of the straight body of the crystal was N region where Cu deposition defects was generated, the region from about 50 cm to 70 cm of the straight body of the crystal was N region without Cu deposition defects, and the region from about 70 cm of the straight body of the crystal to a tail thereof was I region.

(4) By using mirror surface wafers of the lot consisting of 5 wafers in above (1) as bond wafer and base wafer, ion implantation into the bond wafer, bonding with the base wafer, delamination heat treatment, bonding heat treatment (bonding oxidation) and so on were performed according to the ion implantation delamination method based on the processes shown in FIG. 1. After that, SOI wafers having an insulator oxide film with a thickness of 70 nm and a silicon active layer with a thickness of 200 nm were produced.

The SOI wafer as produced above was processed by selective etching with potassium hydroxide solution to remove the active layer. Then, the base wafer having remaining insulator oxide film layer was evaluated by Cu deposition method with an electric field intensity of 6 MV/cm.

Figure 8:
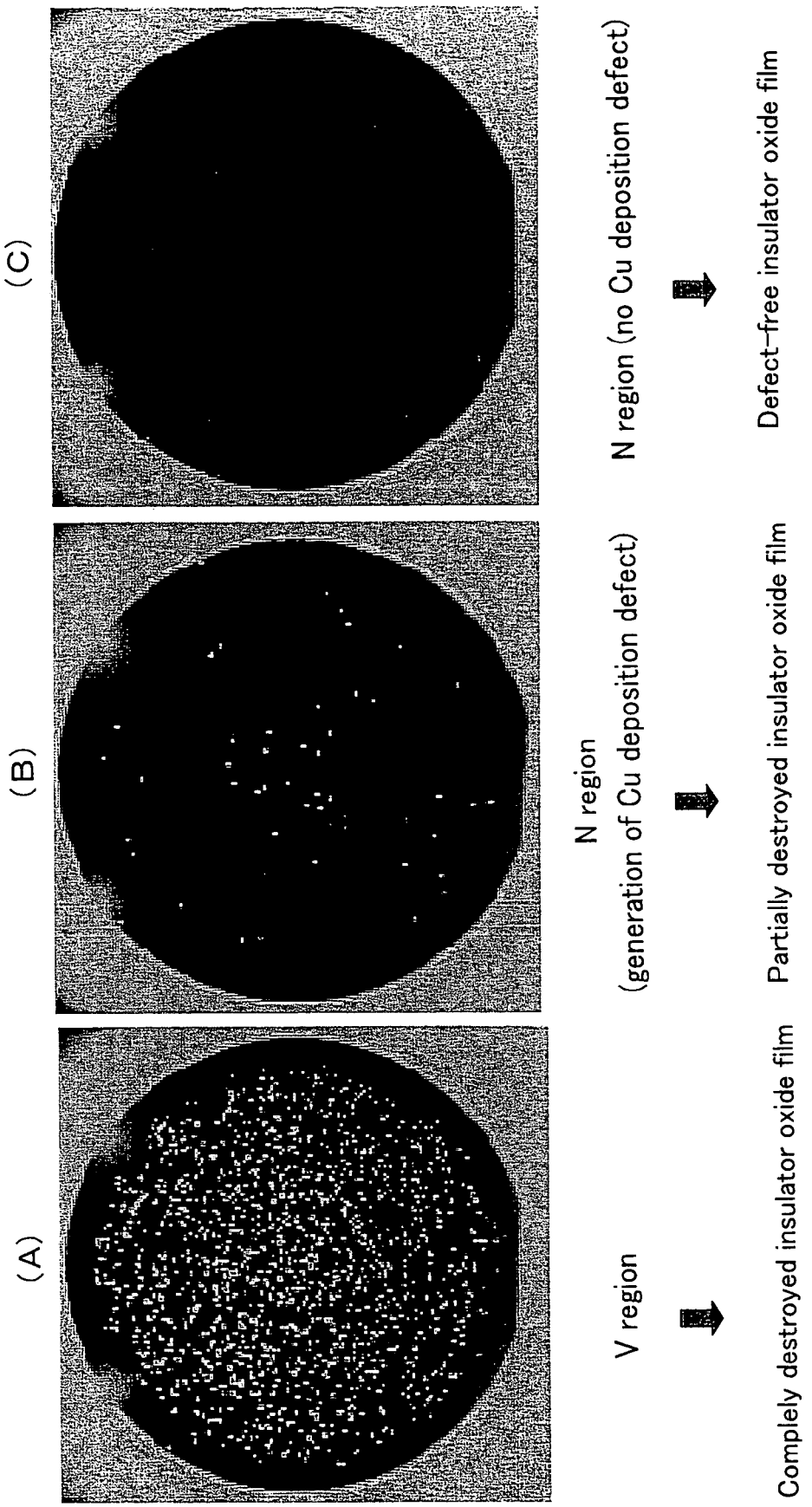
FIG. 8 shows a defect distribution of each region of a crystal by Cu deposition method:
(A) V region,
(B) N region (generation of Cu deposition defects),
(C) N region (no Cu deposition defect).
Figure 9:
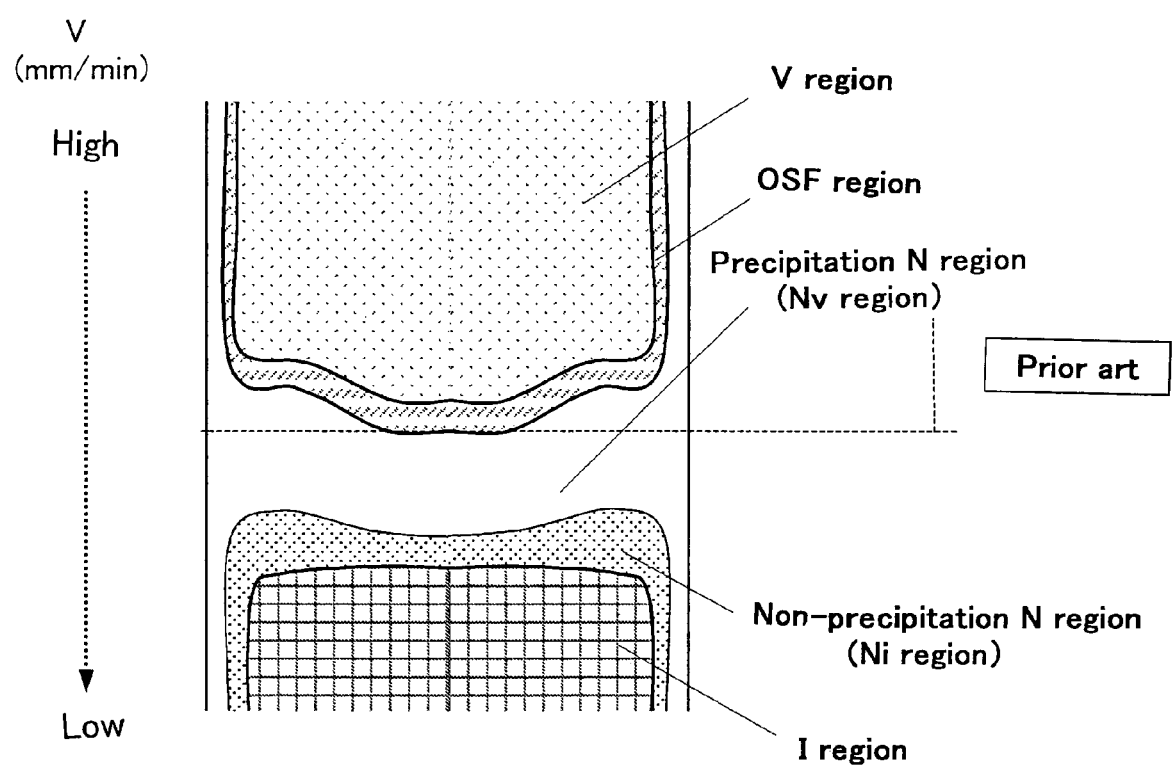
FIG. 9 is an explanatory view showing a region of a crystal.

As a result, in the case of insulator oxide film after bonding oxidation, destruction of the oxide film was confirmed in base wafers which are within V region, OSF region and N region in which Cu deposition defects are generated (see FIGS. 8(A) and (B)), and destruction of the oxide film wasn't generated in base wafer that is within N region that doesn't include Cu deposition defects region (see FIG. 8(C)

EXAMPLE 2

(Experiment 3) Confirmation of Pulling Conditions:

By using the apparatus 30 for producing a single crystal shown in FIG. 3, the experiment on gradual lowering of a crystal growth rate was performed as described below and the growth rates at boundaries between respective regions were examined.

First, 150 kg of polycrystalline silicon as a raw material was charged in a quartz crucible having a diameter of 24 inches (600 mm), and a silicon single crystal having a diameter of 210 mm was grown. Oxygen concentration was controlled in the range of 23-26 ppma (ASTM'79 value). When growing the single crystal, as shown in FIG. 10 (A), a growth rate was controlled to be linearly and gradually lowered from a head to a tail of the crystal in the range from 0.80 mm/min to 0.40 mm/min.

Then, as shown in FIGS. 10(A) and (B), the pulled single crystal was cut lengthwise in the direction of the crystal growth axis from the head to the tail, and after that, mirror-finished samples in a shape of a wafer having a diameter of 200 mm were produced.

As to one of the samples, a distribution of each region of V region, OSF region and I region, and the growth rates at the boundaries of the regions were confirmed by means of wafer lifetime (WLT) measurement (measuring instrument: SEMI-LAB WT-85) after heat treatment for oxygen precipitation. The detailed evaluation process in this experiment will be given below.

(a) The ingot having a diameter of 210 mm was cut into blocks by a length of 10 cm in the direction of a crystal growth axis, and each of them was then cut lengthwise in the direction of the crystal growth axis. Thereafter, mirror-finished samples in a shape of wafer with a diameter of 200 mm (8 inches) in a direction perpendicular to the crystal growth axis as shown in FIG. 5 were obtained.

(b) One of the above samples was subjected to heat treatment at 620° C. for 2 hours (nitrogen atmosphere) in a heat treatment furnace for wafer and to subsequent two-step heat treatment consisting of heat treatment at 800° C. for 4 hours (nitrogen atmosphere) and heat treatment at 1000° C. for 16 hours (dried oxygen atmosphere). Then it was cooled and a WLT map was created by SEMILAB WT-85.

Results of Experiment

From the above-mentioned experiment, growth rates at the boundaries of regions such as V region, OSF region, N region and I region were confirmed.

V region/OSF region boundary: 0.595 mm/min,

OSF region/N region boundary: 0.587 mm/min,

N region/I region boundary: 0.579 mm/min.

(Experiment 4) Manufacture of an SOI Wafer:

In the same apparatus as Experiment 3 shown in FIG. 3, 150 kg of polycrystalline silicon as a raw material was charged into a 24-inch quartz crucible. 2 ingots having a diameter of 210 mm were pulled based on the results in experiment 3.

Figure 11:
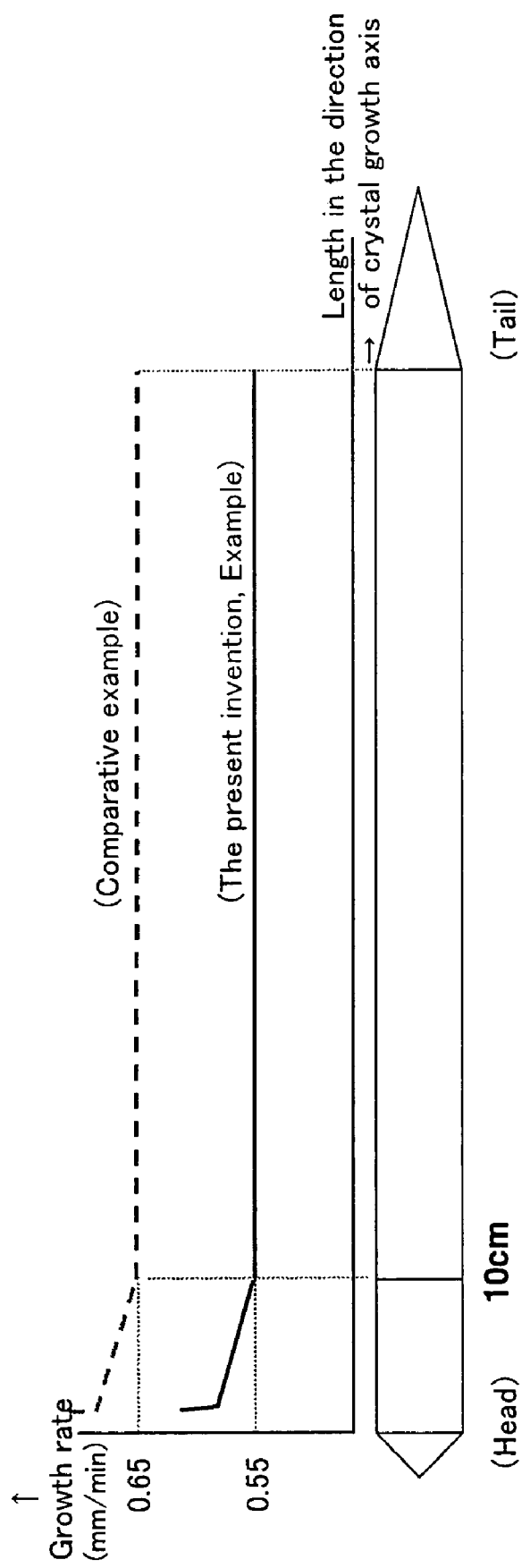
FIG. 11 is an explanatory view showing each growth rate of grown silicon single crystals.

In this time, as shown in FIG. 11, the first ingot was pulled with setting constant growth rate of 0.65 mm/min from the head to the tail of the crystal to form V region over the whole surface of the plane. The second ingot was pulled with setting constant growth rate of 0.55 mm/min from the head to the tail of the crystal to form I region over the whole surface of the plane. Also, the crystal was produced so that the oxygen concentration was 24-26 ppma (ASTM'79). Then mirror surface wafers processed from each ingot were used as base wafers.

On the other hand, a silicon single crystal, which is occupied by N region and does not include defect region detected by Cu deposition method, was grown using different hot zone, and a mirror surface wafer obtained from this single crystal was used as a bond wafer.

The base wafers the whole surface of which is occupied by V region or I region and the bond wafers which are defect-free as mentioned above were used to produce SOI wafers in which the insulator oxide film has a thickness of 70 nm and the silicon active layer has a thickness of 200 nm, respectively.

The SOI wafers as produced above were processed by selective etching with potassium hydroxide solution to remove the silicon active layer. Then, the base wafer having remaining insulator oxide film layer was evaluated by Cu deposition method with an electric field intensity of 6 MV/cm.

Figure 12:
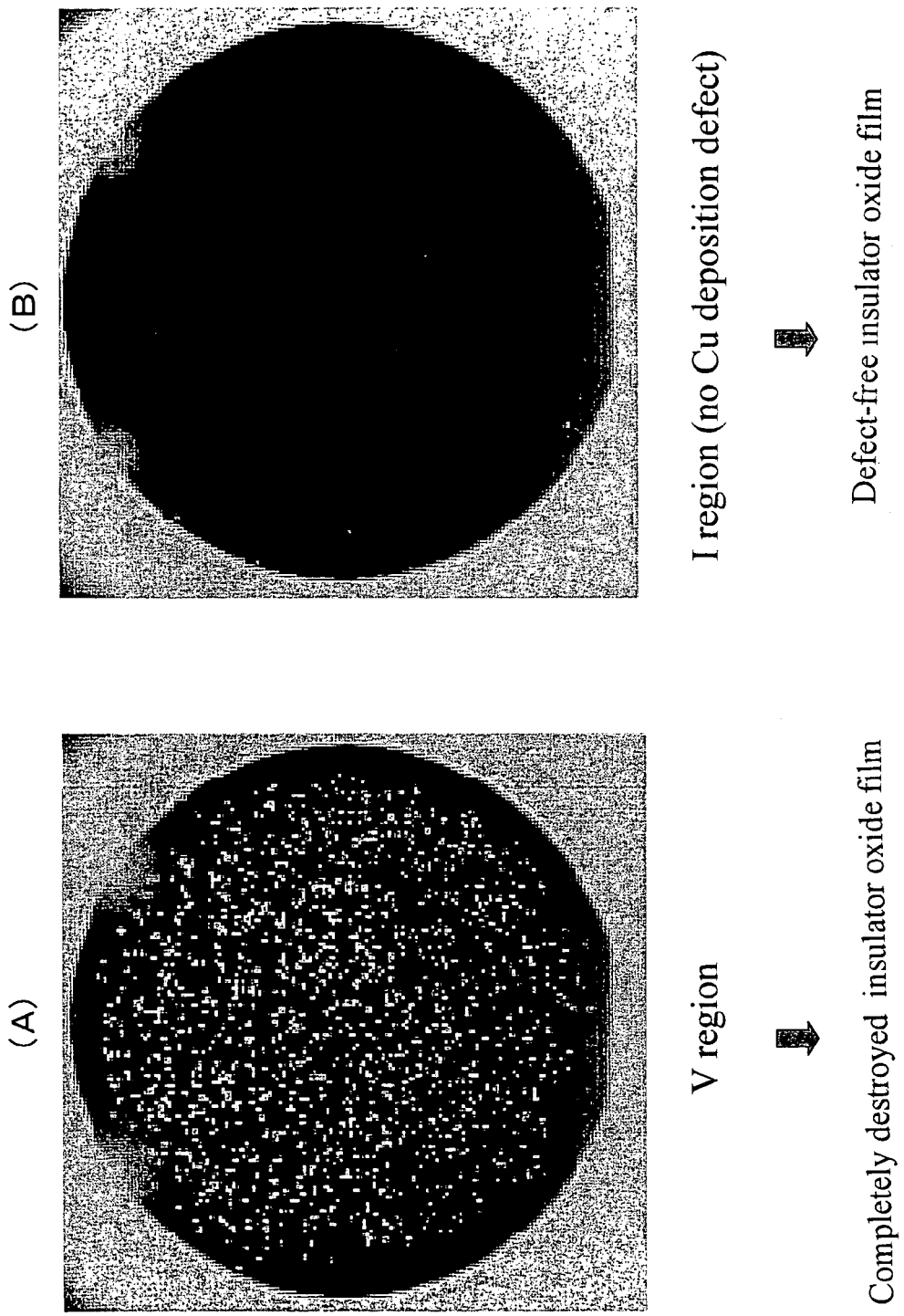
FIG. 12 shows defect distribution by Cu deposition method:
(A) a base wafer within V region,
(B) a base wafer within I region (no Cu deposition defect).

As a result, in the case of insulator oxide film after bonding oxidation, destruction of the oxide film was confirmed in the base wafer the whole surface of which is occupied by V region as shown in FIG. 12(A). On the contrary, destruction of the oxide film wasn't generated in the base wafer the whole surface of which is occupied by I region as shown in FIG. 12(B).

The present invention is not limited to the embodiment described above. The above-described embodiment is mere an example, and those having substantially the same structure as technical ideas described in the appended claims and providing the similar functions and advantages are included in the scope of the present invention.

For example, in the embodiment, the case of producing an SOI wafer by using two silicon wafers by ion implantation delamination method is explained, but the present invention can also be applied to an SOI wafer produced by thinning backside of the bond wafer by grinding and polishing and the like after bonding.

The invention claimed is:

1. An SOI wafer in which a base wafer and a bond wafer respectively consisting of silicon single crystal are bonded via an oxide film having a thickness of 10 nm-100 nm, and then the bond wafer is thinned to form a silicon active layer, wherein the base wafer is formed of silicon single crystal grown by Czochralski method, and a whole surface of the base wafer is within an N region outside of an OSF region and does not include a defect region detected by Cu deposition method, or the whole surface of the base wafer is within a region outside of the OSF region, does not include a defect region detected by Cu deposition method, and includes an I region containing dislocation cluster due to interstitial silicon.

2. The SOI wafer according to claim 1, wherein the SOI wafer is produced by ion implantation delamination method in which ions are implanted into the bond wafer and the bond wafer is thinned by delamination at the ion-implanted layer.

3. The SOI wafer according to claim 1, wherein the silicon active layer consists of silicon single crystal grown by Czochralski method, and the whole surface of the silicon active layer is within the N region outside of the OSF region and does not include the defect region detected by Cu deposition method.

4. The SOI wafer according to claim 2, wherein the silicon active layer consists of silicon single crystal grown by Czochralski method, and the whole surface of the silicon active layer is within the N region outside of the OSF region and does not include the defect region detected by Cu deposition method.

5. A method for producing an SOI wafer comprising at least the steps of: forming an oxide film having a thickness of 10 nm-100 nm, at least on one of a base wafer and a bond wafer respectively consisting of silicon single crystal, implanting ions into the bond wafer to form an ion-implanted layer, bonding a surface of an ion-implanted side of the bond wafer and the base wafer via the oxide film, and delaminating the bond wafer at the ion-implanted layer as a boundary, wherein the base wafer is formed of silicon single crystal grown by Czochralski method, and the whole surface of the base wafer is within an N region formed at lower speed than an OSF region generated in a ring shape when grown with gradually decreasing pulling rate from high speed to low speed, and does not include a defect region detected by Cu deposition method, or the whole surface of the base wafer is within a region formed at lower speed than the OSF region generated in a ring shape when grown with gradually decreasing pulling rate from high speed to low speed, does not include the defect region detected by Cu deposition method, and includes an I region containing dislocation cluster due to interstitial silicon.

6. The method for producing an SOI wafer according to claim 5, wherein the bond wafer is formed of silicon single crystal grown by Czochralski method, and of which the whole surface is within the N region formed at lower speed than the OSF region generated in a ring shape when grown with gradually decreasing pulling rate from high speed to low speed and does not include the defect region detected by Cu deposition method.

* * * * *